United States Patent [19]

Schippers

[11] Patent Number: 5,256,845
[45] Date of Patent: Oct. 26, 1993

[54] APPARATUS FOR SEALING MEDICAL PLASTIC TUBING WITH HIGH FREQUENCY DIELECTRIC HEATING

[75] Inventor: Alex Schippers, TC Exloo, Netherlands

[73] Assignee: NPBI Mederlands Produktielaboratorium Voor Bloedtransfusieapparatuur en Infusievloeistoffen B.V., Emmer-Compascuum, Netherlands

[21] Appl. No.: 823,568

[22] Filed: Jan. 21, 1992

[51] Int. Cl.$^5$ .............................................. H05B 6/50
[52] U.S. Cl. ............................ 219/10.53; 219/10.77; 219/10.81; 361/818; 156/380.2; 156/380.8
[58] Field of Search ............... 219/10.75, 10.77, 10.81, 219/10.53, 10.73; 156/380.2, 380.3, 380.6, 380.8, 274.4, 380.4; 174/35 R; 361/424

[56] References Cited

U.S. PATENT DOCUMENTS

| | | | |
|---|---|---|---|
| 2,473,041 | 6/1949 | Urbain et al. | 219/10.81 |
| 2,504,754 | 4/1950 | Sweeny | 219/10.77 |
| 2,529,560 | 11/1950 | Larys | 219/10.77 |
| 4,013,860 | 3/1977 | Hosterman et al. | 219/10.81 |
| 4,531,038 | 7/1985 | Lillibridge et al. | 219/10.81 |
| 4,900,887 | 2/1990 | Keller | 219/10.77 |

Primary Examiner—Philip H. Leung
Attorney, Agent, or Firm—Herbert Dubno

[57] ABSTRACT

Spurious emission from an apparatus for sealing medical tubing is prevented by providing a tuned circuit of capacitors and inductors between amplifier stages, by providing a low-pass filter of such resonant networks at the input and the output of the generator and by providing a radiation-shielding housing.

4 Claims, 10 Drawing Sheets

APPARATUS FOR SEALING MEDICAL PLASTIC TUBING WITH HIGH FREQUENCY DIELECTRIC HEATING

FIELD OF THE INVENTION

My present invention relates to an apparatus for sealing medical plastic tubing using high-frequency or radio-frequency energy, for use in a hospital or clinical environment in laboratories and in bloodbanks. More particularly, the invention relates to an apparatus of this type with reduced emission of spurious radiation which may be detrimental to other sensitive equipment at such sites and to operations utilizing high-frequency signals.

BACKGROUND OF THE INVENTION

It is known to provide infusion sets, blood collection and transfer bags and a variety of other medical units for administration of liquids to a patient or for the transfer of solutions between vessels which utilize plastic tubing. Such tubing may be polyvinylchloride tubing or other thermoplastic tubing.

Frequently it is important to hermetically seal the tubing and, for this purpose, high-frequency or radio-frequency systems have been provided heretofore.

A typical system for this purpose can include a radio-frequency generator connected to a sealing head provided with a pair of electrodes adapted to pinch the tubing between them and, when the electrodes are supplied with the radio-frequency energy, to cause fusion of the internal walls of the pinched tubing and thus a hermetically closed seal at the pinch. The sealing jaws or electrodes can function as capacitor plates in a tuned network or circuit supplied with a high-frequency energy, see the commonly owned copending application Ser. No. 07/820,040 filed Jan. 13, 1992.

Prior art circuitry and systems of this type are described in U.S. Pat. Nos. 4,013,860, 4,186,292, 4,390,832, 4,490,598, 4,529,832, 4,488,028, 4,491,711 and 4,496,819 assigned to Engineering and Research Associates, Inc. of Tucson, Ariz.

The systems described in these patents utilize an RF generator which generates electrical energy with a fundamental frequency of 40.68 MHz that is connected to a sealing head with a 50 ohm coaxial cable. The sealing head may transform the supplied energy to a high voltage of, said 1500 volts, as has been found to be necessary to generate sufficient heat in the tubing to cause it to melt.

One of the drawbacks of these earlier devices for sealing medical plastic tubing is that in addition to the fundamental frequency of high energy which is produced, two types of undesirable frequencies are also generated and emitted.

One of these types is a group of frequencies that are close to the fundamental frequency and these undesired frequencies may be caused by an incorrect choice or mounting of the components of the electrical circuit.

Interference from these incorrect frequencies can be prevented by the selection of correct components and by the mounting of them and the trimming of them so that the spurious radiation of the first type will not be generated.

The second type of spurious frequencies are multiples of the fundamental frequency. These undesirable frequencies are a result of the action of nonlinear components, like electron tubes or transistors which cause nonlinear distortions.

The original sinusoid of the signal is distorted to a non-sinusoid signal. Such a non-sinusoid can be seen as the sum of the original frequency and one or more multiples thereof (Fourier-analysis). As these multiples of the fundamental frequency, the so-called harmonics, are amplified by each amplifier stage, they will reach the sealing head. During the total cycle of generating the signal, the amplification and applying the signal to the sealing head, the harmonics will be emitted.

When an electric signal is supplied to a linear circuit, e.g. a voltage divider containing two resistors, it will undergo a certain processing.

Suppose the voltage divider weakens the signal by a factor of two, then the signal will be exactly the same coming out of the divider, only two times weaker.

When a sinusoidal signal is supplied to such a factor two resistor voltage divider, it can be formulated:

$$V_{OUT} = V_{in} \times V_{char}$$

where
$V_{out}$ = the outgoing voltage
$V_{in}$ = the supplied sinusoid AC voltage being $\sin(2\pi f)$
$V_{char}$ = the transfer characteristic of the circuit, being 0.5 in this case.
making $$V_{out} = \sin(2\pi f) \times 0.5 = \tfrac{1}{2} \sin(2\pi f).$$

As can be seen, the frequency of the signal will stay untouched when the resistors are linear components with a constant transfer characteristic, independent of the level of the voltage. No signals will be generated on undesired frequencies.

However as the concept of a RF generator is based on signal amplifying, it is necessary to make use of transistors and electron tubes. These components have a non-linear transfer characteristic. This means that the transfer of the signal is not constant but depending on the voltage of this signal.

When we supply a sinusoid signal to a non-linear component, this signal will be deformed due to the curvature of the transfer characteristic. The original signal will therefore change in magnitude and in shape.

The Fourier analysis indicates that every form of signal can be decomposed into sinusoid signals, including a fundamental frequency and one or more spurious frequencies.

Suppose a sinusoidal signal is supplied to a component with a pure square characteristic, which can be formulated:

$$V_{out} = (V_{in})^2$$

where
$V_{out}$ = the outgoing voltage
$V_{in}$ = the supplied voltage, being $x + \sin(2\pi f)$
making $$V_{out} = \{x + \sin(2\pi f)\}^2 = x^2 + 2x\sin(2\pi f) + \tfrac{1}{2} - \tfrac{1}{2}\cos(4\pi f)$$

It can be seen (using the half angle relationship $\cos 2\alpha = 1 - 2\sin^2\alpha$) that a frequency is formed that is twice the fundamental frequency. This is called the second harmonic. However non-linear components, as this amplifier component, seldom have a pure square character, but will mostly have a much more complicated form. This means that not only a second harmonic will be formed, but a large number of harmonics, all having in common that they are multiples of the fundamental frequency.

It can be concluded that due to the application of amplifying components as transistors and electron tubes in a RF generator, spurious radiation will be generated on frequencies that lie outside the fundamental frequency.

The generation of RF energy is limited by national and international standards concerning the frequencies that are open for emitting and the amount of spurious radiation that is allowed on other frequencies. This is e.g. established in the international standards such as the CENELEC, EN 55022, CISPR 11 and the VDE 0871. In Germany the devices as described in this invention are subject to the standards of VDE 0871.

In most cases the harmonics of the fundamental frequency lie in areas of frequencies where strong limits apply on the amount of radiation that is emitted. When the devices that are on the market at the moment are tested according to the VDE standards, it is found that they are far from those standards.

The consequences of being off standard of these devices are very noticeable in is bloodbanks and laboratories. Not only the radio reception heavily disturbed, but also the emitting of spurious radiation can cause fine tuned laboratory machinery to fail, making test results insecure. In general this kind of radiation can cause all sorts of undesired radio interference in telecommunications for aeronautics, telephone, etc.

OBJECTS OF THE INVENTION

It is, therefore, the principal object of the present invention to provide an apparatus for sealing medical tubing utilizing radio-frequency energy which is free from the drawbacks outlined above.

Another object of this invention is to provide an apparatus for sealing medical tubing which ensures that the electrodes are excited only with a single frequency, i.e. a fundamental frequency and that interfering radiation of other frequencies are not emitted or are emitted only at very low levels.

SUMMARY OF THE INVENTION

These objects and others which will become apparent hereinafter are attained, in accordance with this invention in an apparatus of the type described in which a radio-frequency generator supplied RF energy to a pair of electrodes of a sealing head adapted to clamp medical tubing between them and which comprises, in addition to the RF generator, amplifier means between the RF generator and the sealing head. According to the invention, resonant circuits are provided as couplers between the amplifier stages and between the amplifier stages and the electrodes of the sealing head.

In normal mechanics resonance is commonly known. A tuning fork for instance will only vibrate when a tone is offered that is equal or almost equal to the resonance frequency of this fork. It will not react to any other frequency.

In electronics one can build a similar resonant circuit with a capacity (capacitor) and a self-induction (coil). In such a circuit a constant exchange of energy levels between the magnetic field of the coil and the electric field of the capacitor takes place. This circuit will in theory be in resonance when the apparent resistance of both components is equal, so when:

$$2\pi f L = \tfrac{1}{2}\pi f c$$

with
f = resonance frequency in Hertz
L = self-induction in Henry
C = capacity in Farad Like the example of the tuning fork, this simple resonance circuit has a strong preference for frequencies equal or almost equal to the resonance frequency of the circuit. In a RF seal generator this quality can be used by using them as a coupler between the amplifier stages and at the end of the last stage to the sealing electrodes. By designing this circuit for a resonance frequency equal to the supplied RF frequency, such a circuit will work as a filter which permits the fundamental frequency to pass and stops most of the other frequencies.

By way of illustration, one can refer to the tuning fork again. In a room with many different sounds (= frequencies) the tuning fork will only come into vibration when a frequency is offered that meets his own resonance frequency. When one, at the other hand, withdraws energy from this tuning fork, it can only be energy having this resonance frequency. All other frequencies do not have any influence on the tuning fork.

The coupling of amplifier stages through resonance circuits in the RF generator works accordingly.

If a pure sinusoid RF signal is supplied to a non-linear first electronic amplifier stage, this amplifier stage will introduce all kinds of undesired harmonics to the fundamental frequency and supply it further to the resonance circuit. The resonance circuit however is tuned only to the fundamental frequency and therefore will only transport this frequency to the second amplifier stage. This second stage will amplify this fundamental signal resulting in a stronger signal of the original frequency, including however several harmonics again. Now this amplified signal is again supplied to a resonance circuit, where the harmonics are filtered away, etc.

When the fundamental signal is amplified enough it is, via a last couple of resonance circuits, led to the sealing electrodes.

One can conclude that the use of resonance circuits as couplers between the amplifier stages of a RF generator will effectively suppress most spurious radiation.

Although the application of resonance circuits between and after the amplifier stages in the RF generator will to a great extend prevent the radiation of spurious radiation, there will still remain a certain amount of radiation. A source of this remaining radiation is the circuit itself, the cables and the electrodes.

If necessary other measures can be taken to further reduce this radiation.

One measure is to prevent the generator from passing the harmonic frequencies. This goal can be reached by filtering the outgoing signal through the cable to the sealing head. As the harmonics always are multiples of the fundamental frequency, they will always be higher than this fundamental frequency. It can be concluded, therefore, that the application of a low-pass filter is sufficient to reach the intended goal.

A low-pass filter is an electric circuit, existing of electronic components which are placed in such a configuration that only a specific frequency field can pass and all higher frequencies will be suppressed or weakened.

Different configurations are possible. In one example, a filter is consists of a coil and a capacitor in a resonance circuit.

The signal is supplied to the coil. As the apparent resistance of a coil increases with the frequency of the supplied signal, higher frequencies will pass with greater difficulty than lower frequencies. After the coil, a capacitor is placed in such a way that it can weaken the signal by short-circuiting it. A capacitor is known for the fact that the apparent resistance decreases with increasing frequency.

By choosing the optimal point of short-circuiting the capacitor, the resonance point ($2\pi fL = \frac{1}{2}\pi fc$), one can reach the goal that the fundamental frequency is passed, while the spurious harmonics are weakened, possibly by a factor 10. One can multiply these filter segments at one's own discretion. The more segments the better the filter.

An even further improvement of the filter can be reached by shielding each filter segment separately with a metal box. This will prevent internal influencing of the capacitive and inductive effect of the components.

In addition to filtering the signal in the outgoing cable to the sealing electrodes with a low-pass filter, it is recommended to filter all other, feeding and control, cables that can transport radiation out of the RF generator box. As the alternating voltage can be blocked, these low-pass filters are less critical and it is in most cases sufficient to use only one or two filer segments.

When the ingoing and outgoing lines are filtered accordingly, the major sources of extra spurious radiation will be reduced. The signal inside the RF generator box will however still contain some harmonics that can radiate through the box.

One of the possible extra measures that can be taken to prevent this radiation is to house the total circuit in a metal conducting box. Special care should be taken to guarantee a full contact between the different parts of the box. Especially cracks and seams in the shielding should be carefully attended to.

Undesired openings can be concealed with e.g. conducting foil or netting or conductive adhesive tape or tape with a conducting adhesive, as e.g. marketed by 3M.

BRIEF DESCRIPTION OF THE DRAWINGS

The above and other objects, features and advantages of the present invention will become more readily apparent from the following description, reference being made to the accompanying drawing in which.

DESCRIPTION

Figure 1:
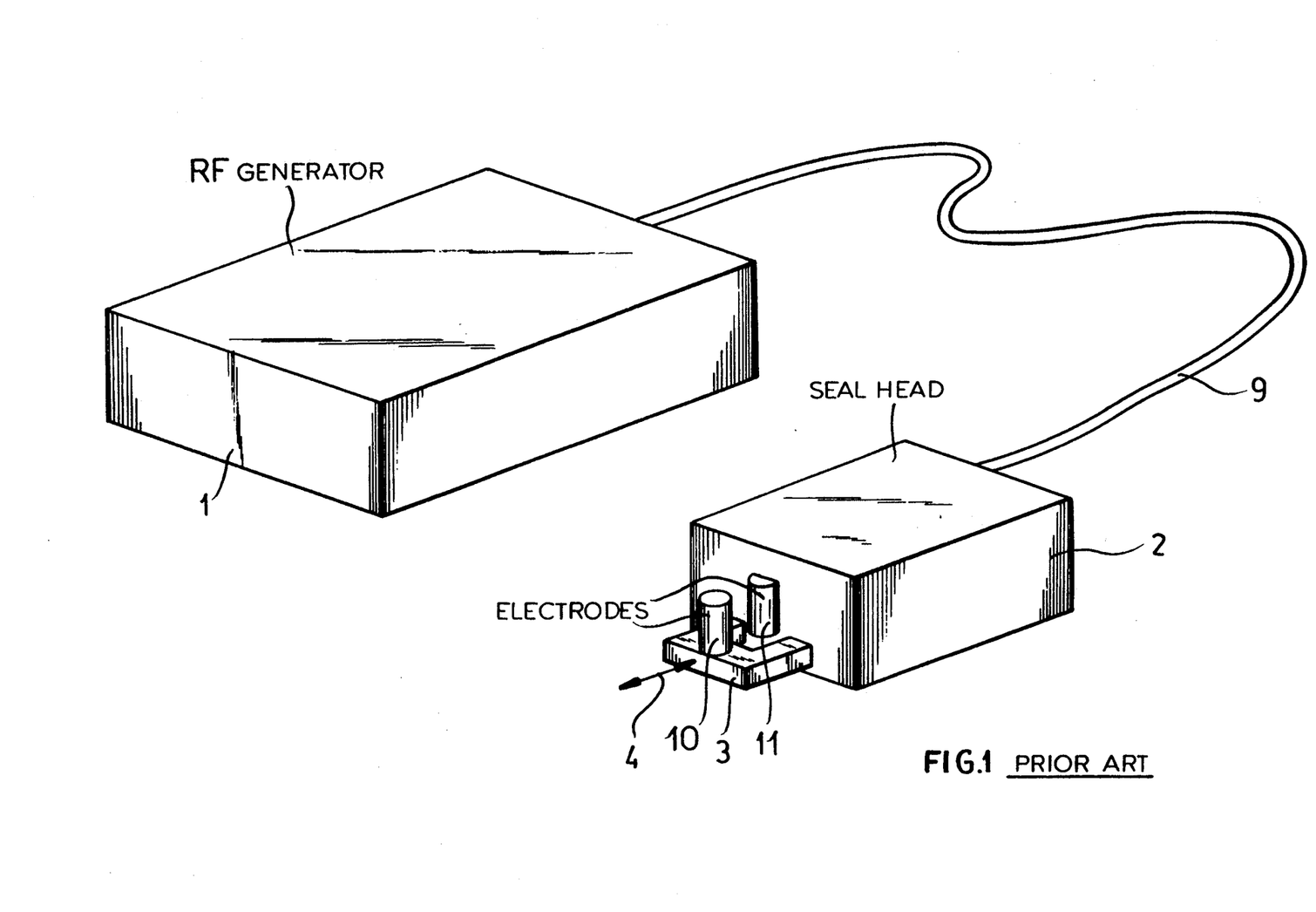
FIG. 1 is a diagram illustrating a prior art apparatus for sealing tubing according to the invention.

As described in connection with the prior art (FIG. 1), an apparatus for the sealing of medical tubing can comprise a radio-frequency generator 1 connected by a coaxial cable 9 with a sealing head 2 in which the electrodes 10 and 11 can pinch the tubing between them. The electrode 10 is mounted on a slider 3 which can be displaced in the direction of the arrow 4 to engage the tubing or release the tubing.

Figure 2A:
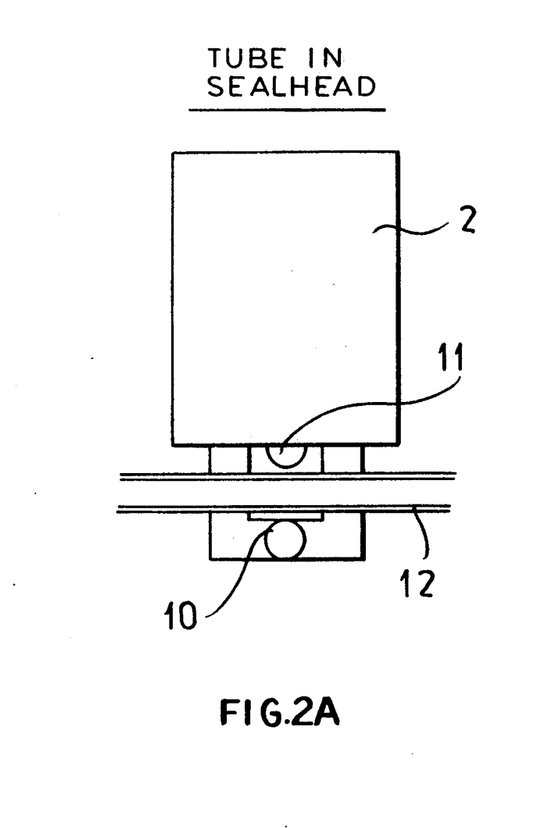
FIGS. 2A, 2B and 2C illustrate successive steps in the sealing of a tube.
Figures 2B, 2C:
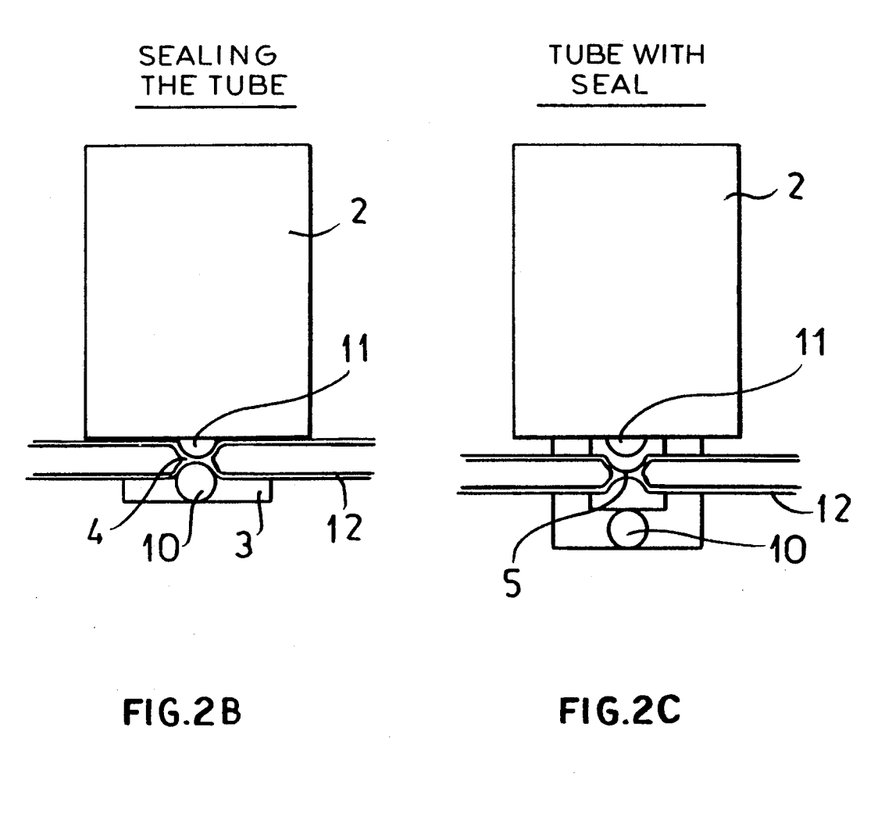

The steps of sealing the tubing are illustrated in FIGS. 2A-2C. The tubing 12 is placed in the sealing head 2 between the electrodes 10 and 11 (FIG. 2A) and the electrode 10 is drawn toward the electrode 11 on the slide 3 (FIG. 2B) while radio-frequency energy is supplied to the electrodes.

The tubing 12 is pinched at 4 and the internal walls of the tubing fuse together under the application of the electrical energy to yield a tube 12 with a seal 5 in the previously pinched zone when the electrodes 10 and 11 are again separated (FIG. 2C).

Figure 3:
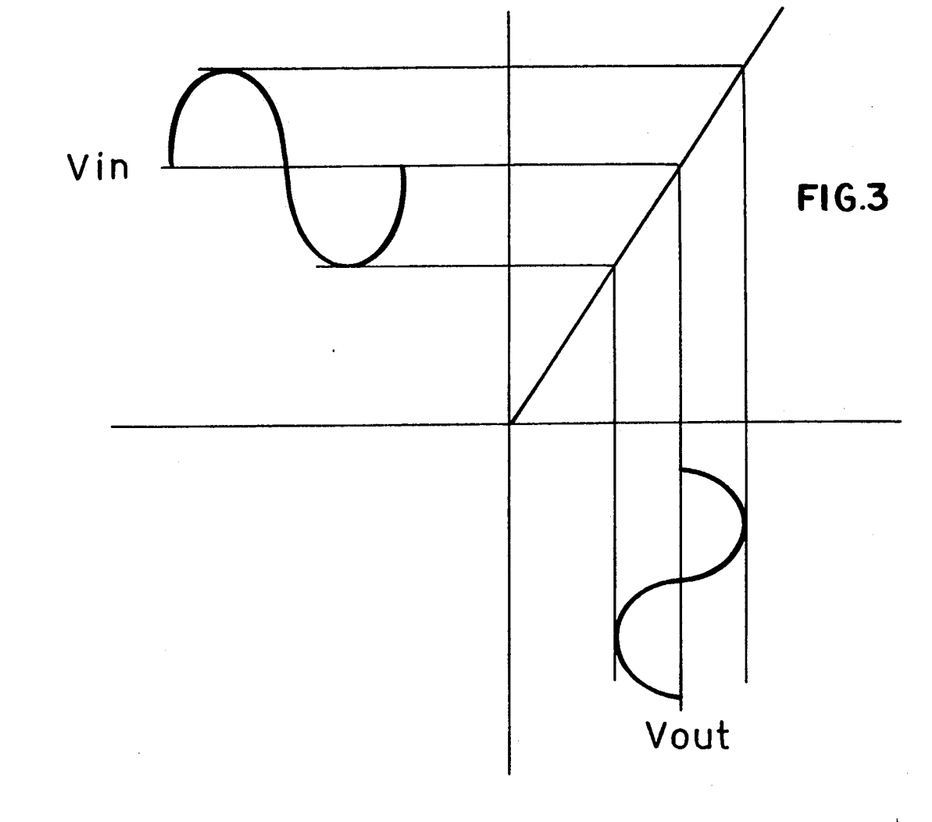
FIG. 3 is a diagram of the relationship between input and output signals for a circuit with linear characteristics.
Figure 4:
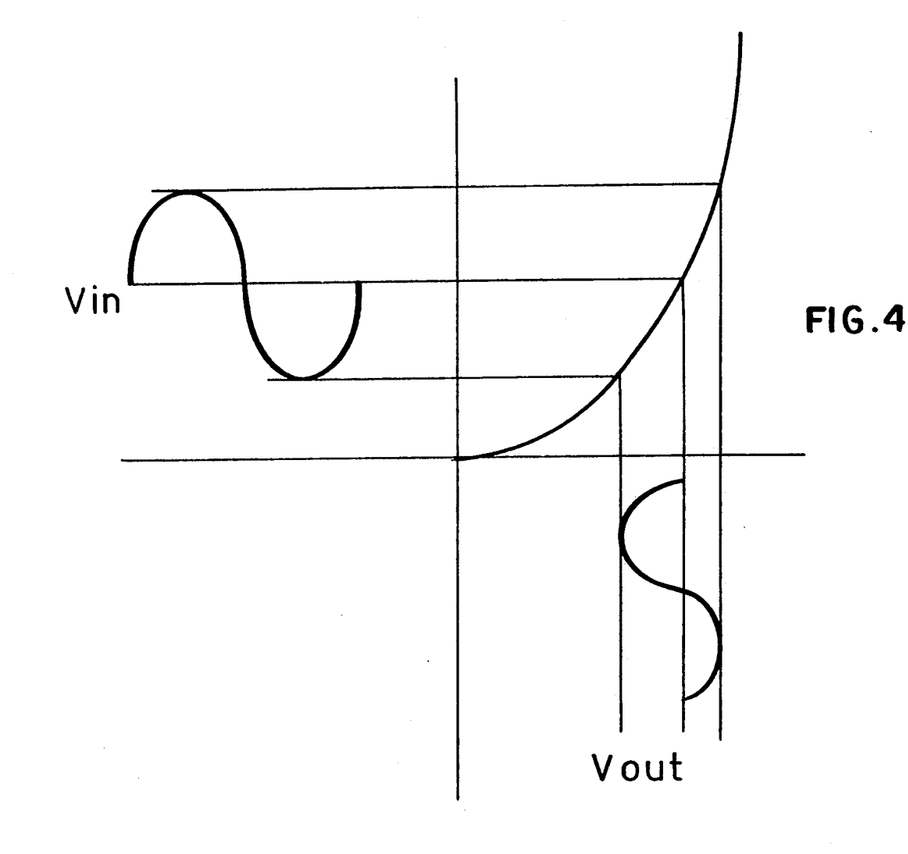
FIG. 4 is a diagram of the relationship of input and output signals with a circuit having nonlinear characteristics.
Figure 5:
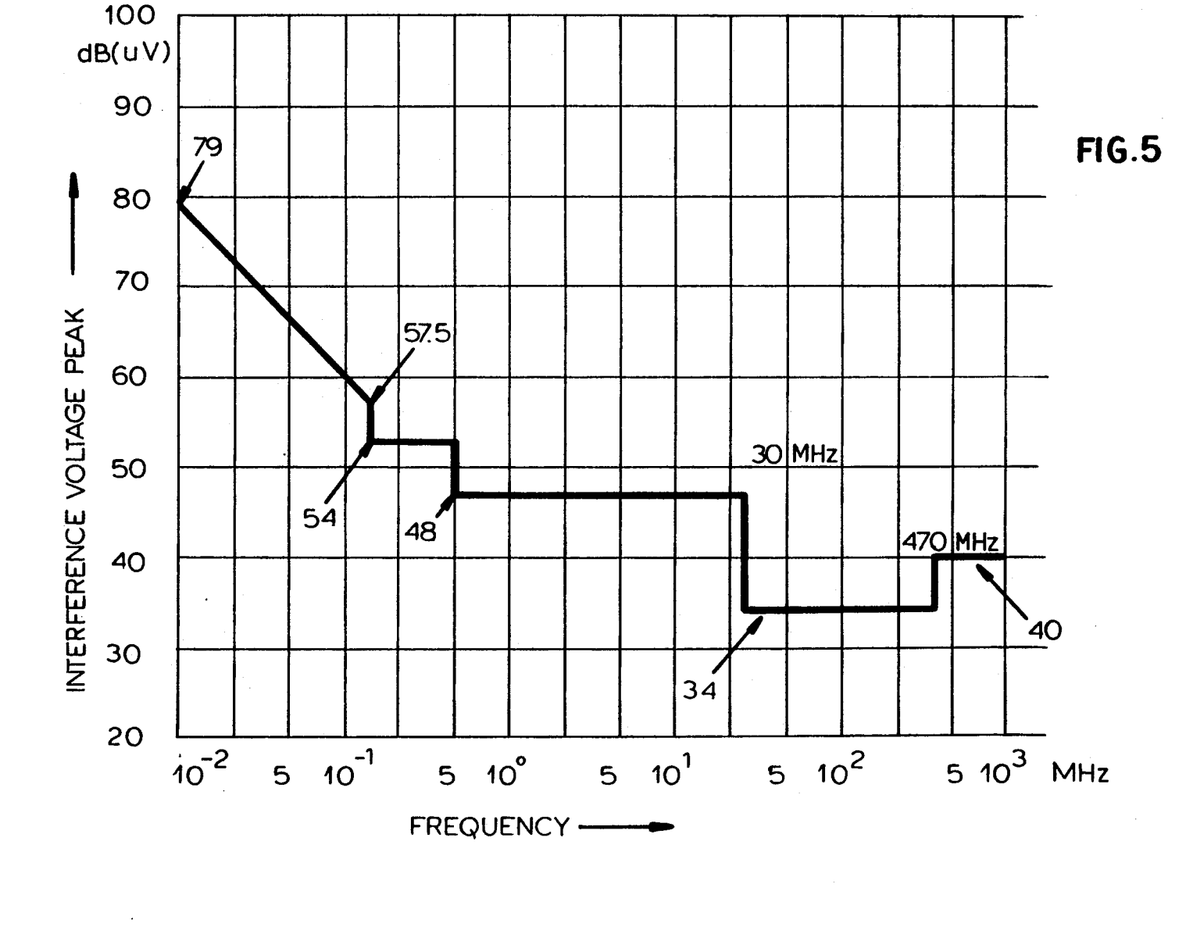
FIG. 5 is a graph illustrating part of the VDE standards with which an apparatus for the sealing of medical tubing in hospitals, laboratories and the like must comply in the Federal Republic of Germany.

In the prior art, the circuit used is normally nonlinear. When a signal is applied to a linear circuit (FIG. 3), e.g. a sinusoidal signal, there may be a diminution of the amplifier, but the shape of the signal emerges intact (compare the input signal $V_{in}$ with the output signal $V_{out}$). When, however, the circuit is nonlinear (FIG. 4), not only is the amplitude of the signal changed, but its shape is also altered. From Fourier analysis, it is possible to break down a signal of any shape, deviating from a pure sinusoid, can be broken down into a fundamental and its harmonics as has been described above. The various regulations, for example, VDE in Germany, specify the level (FIG. 5), plotted along the ordinate for the various interference frequencies plotted along the abscissa, which can be tolerated.

Figure 6:
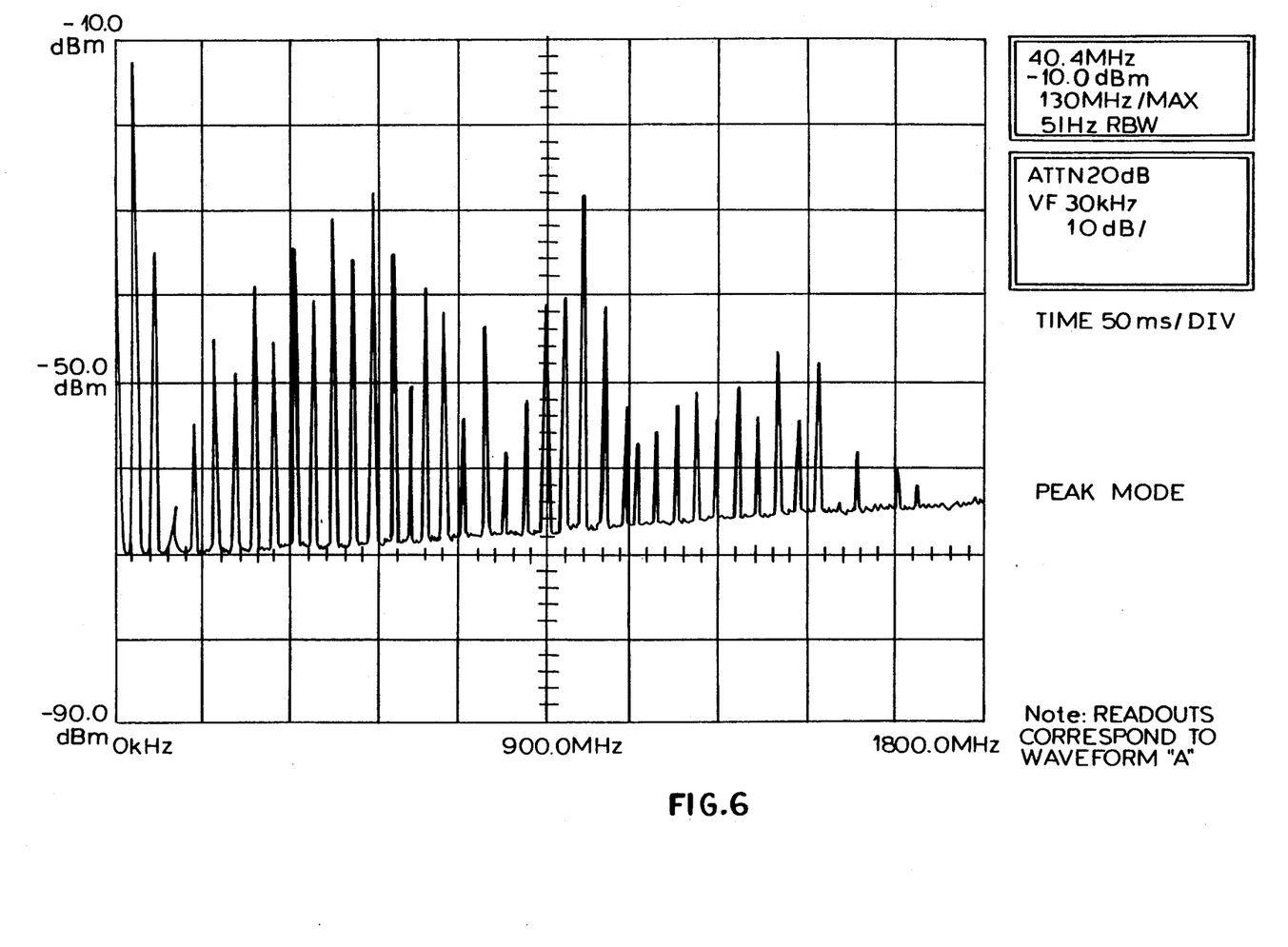
FIG. 6 is a diagram showing waveforms as measured with the prior art apparatus without the resonant network circuitry of the present invention.

The apparatus is then subjected to testing and in FIG. 6 I have shown the results of such a test. The many high level spurious peaks represent the harmonics and, by and large, such spurious signals can interfere with other equipment, also as has been described.

Figure 9:
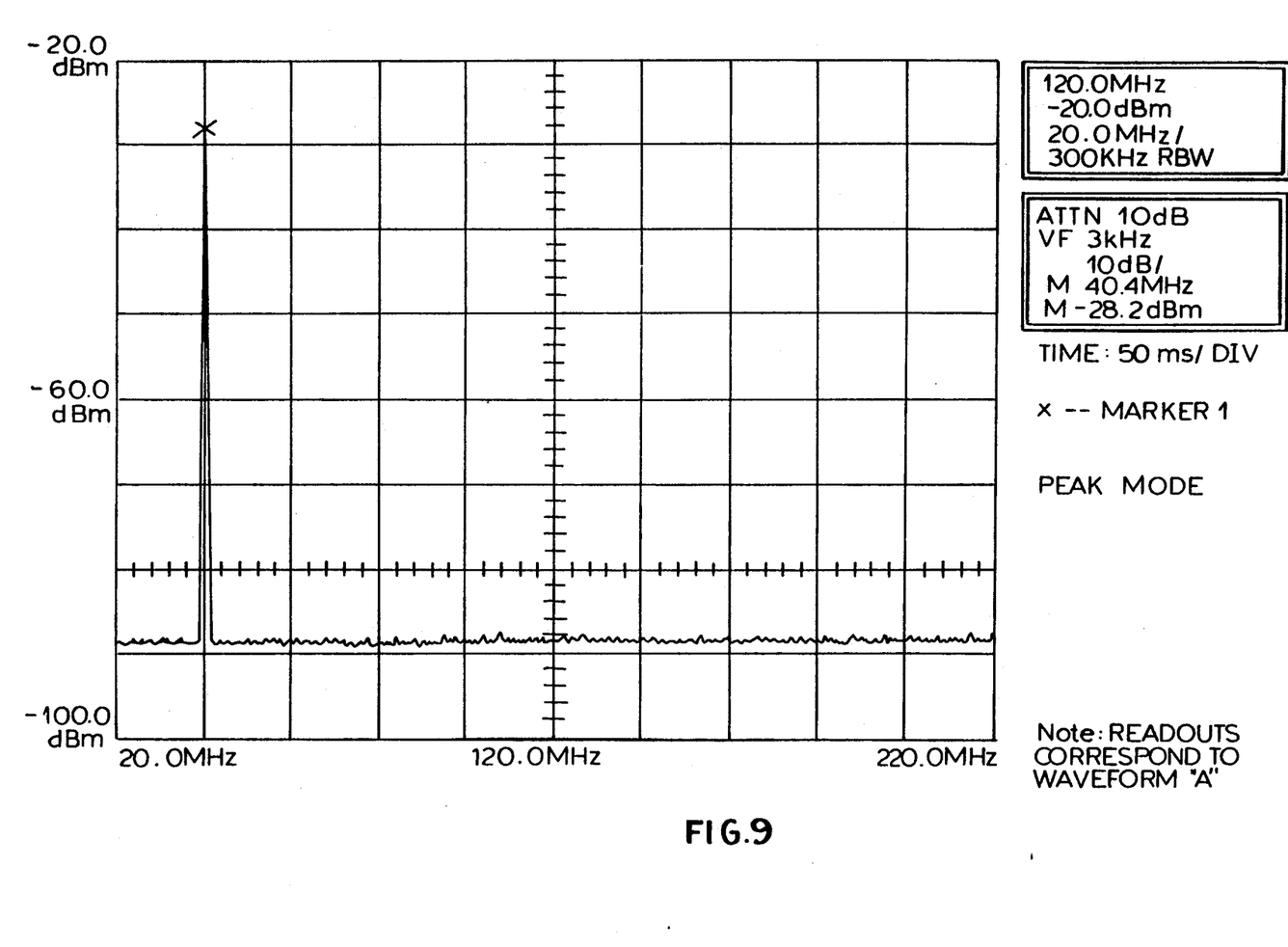
FIG. 9 is a diagram equivalent to FIG. 6 but showing the results obtained with the present invention.

These peaks in spurious signals can be eliminated without material reduction of the fundamental frequency at 40.68 MHz (compare FIGS. 6 and 9) by the use of the circuitry of the invention.

In one aspect of the invention (FIG. 7), the amplifier stages between an RF generator and the sealing electrodes are coupled by resonant networks or circuits which can amplify the fundamental but filter out the harmonics. In these systems, the amplifier elements are represented by transistors Q2 and Q3, for example, which are fed through voltage dividers R2, R3 and R4, R5, respectively, and have resonant networks or circuits LC1, LC2, each consisting of a tapped inductor L5, L6 and a capacitor C5, C6 in parallel therewith.

Figure 7:
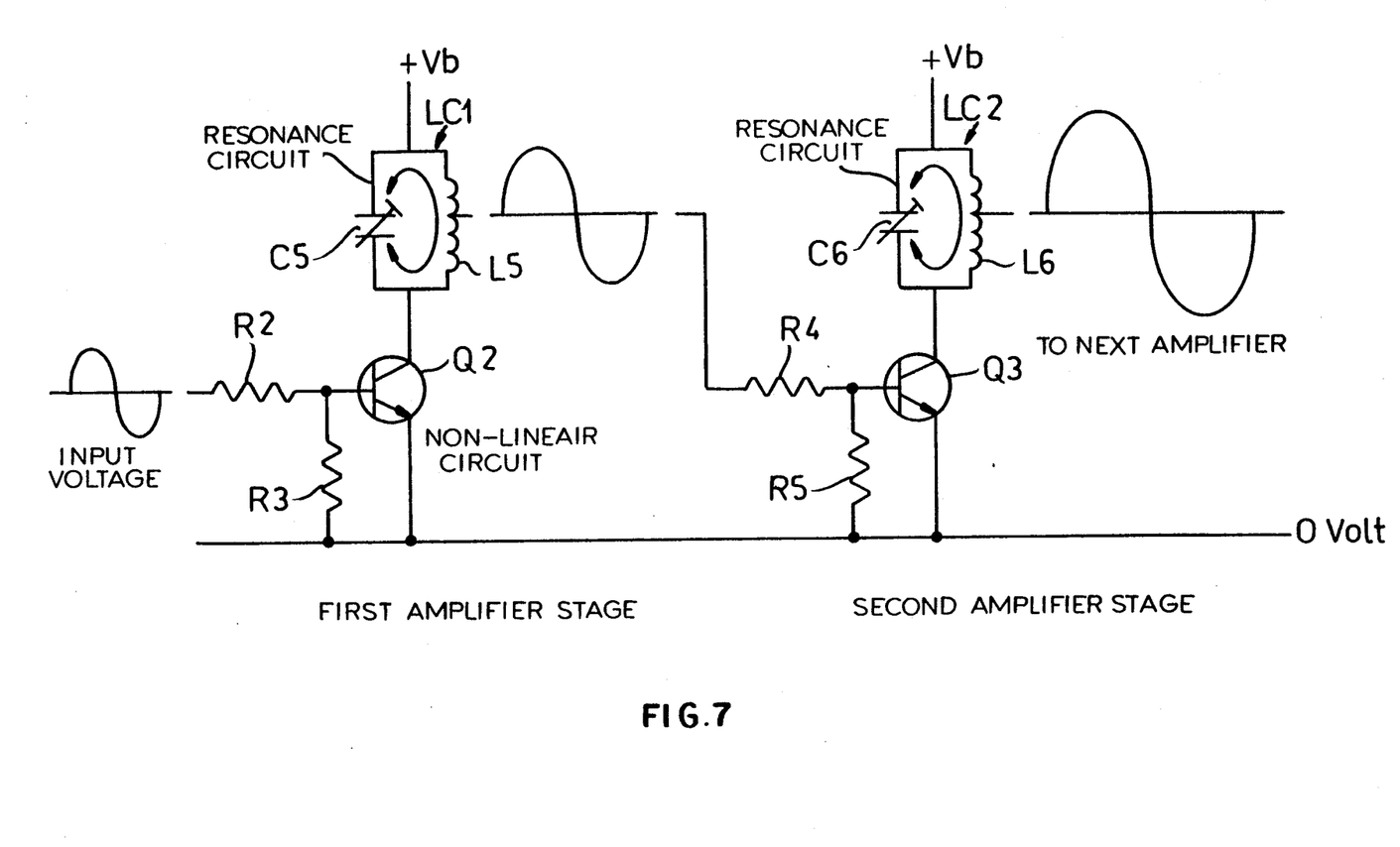
FIG. 7 is a circuit diagram showing the use of resonant networks to couple amplifier stages.
Figure 8:
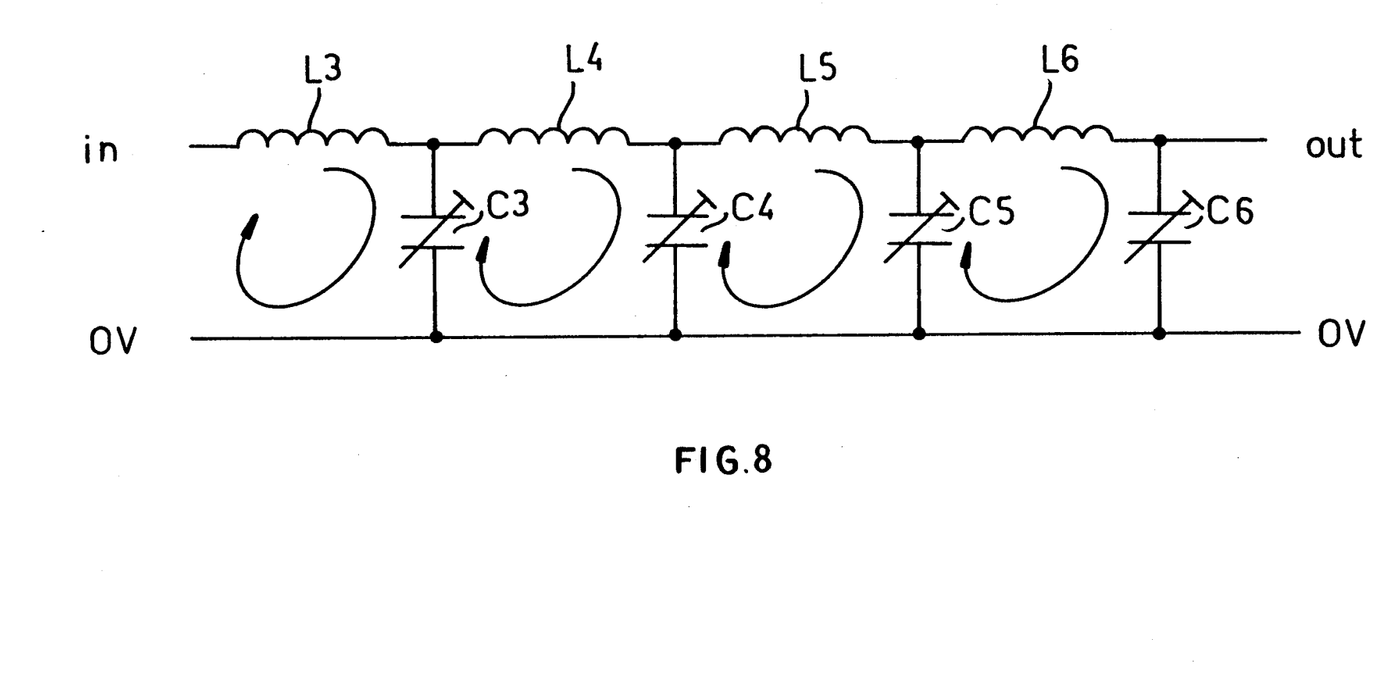
FIG. 8 is a diagram of a cascade of resonant networks forming a low-pass filter.

Another approach, advantageously utilized in conjunction with the approach of FIG. 7, is to provide (FIG. 8) between the last amplifier stage of the RF generator and the electrodes, a low-pass filter as can be seen from FIG. 8. The low-pass filter comprises cascade resonant networks, each having an inductor L3, L4, L5, L6, and a capacitor C3, C4, C5, C6.

Figure 10:
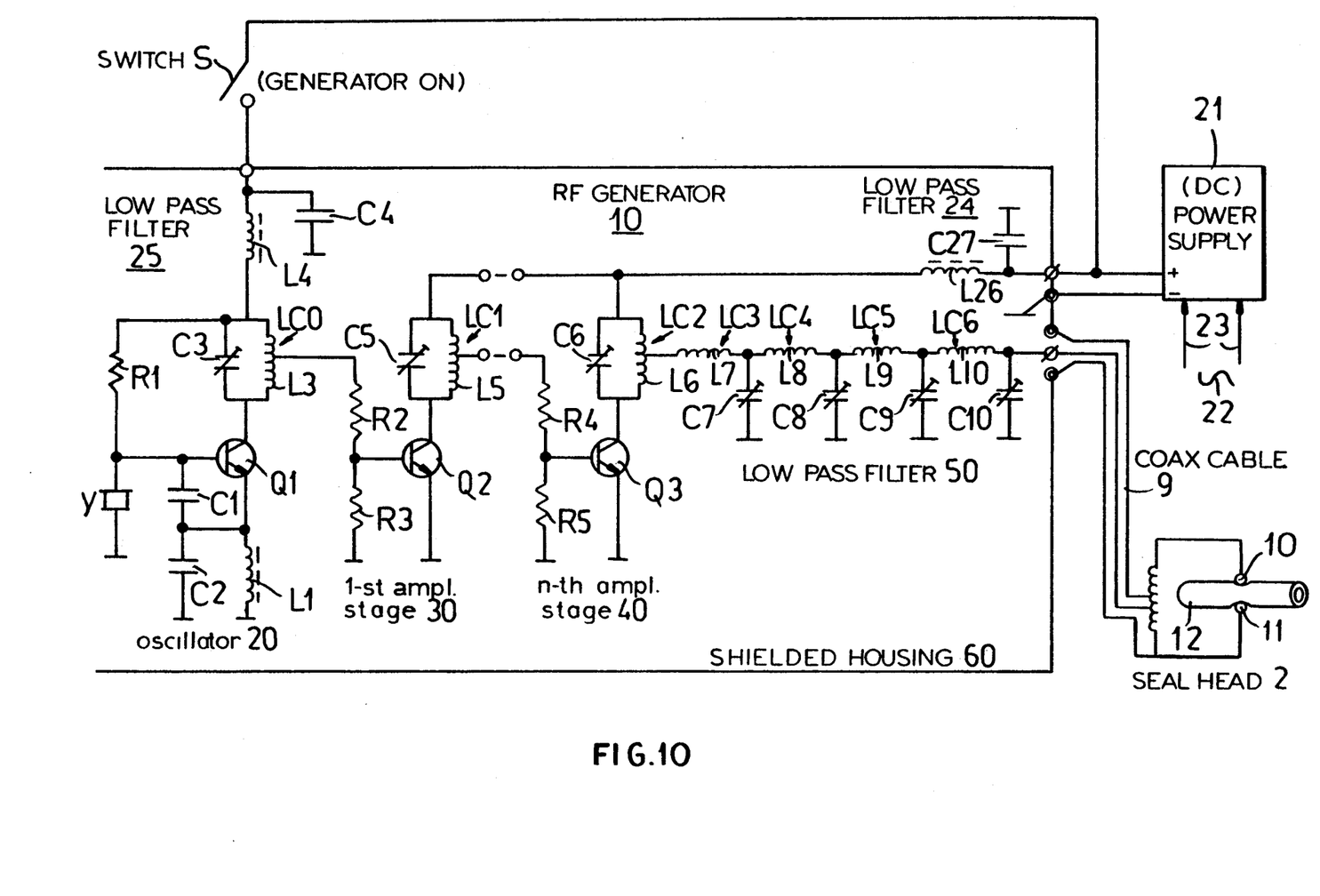
FIG. 10 is a circuit diagram embodying circuitry of FIGS. 7 and 8, for an improved power supply for the apparatus in accordance with the invention but otherwise having the configuration of the apparatus of FIG. 1.

In FIG. 10, I have shown a comprehensive circuit diagram of an apparatus according to the invention in which the sealing electrodes forming a capacitor and constituted by the bodies 10 and 11 which compress the tubing 12 between them, are energized by radio frequency at, say 40.68 MHz by a radio frequency generator 10. The latter can have a power supply 21 delivering the requisite positive DC voltages at the terminals marked + and any necessary negative DC voltage at the terminal marked −, this power supply being energized with an alternating line current represented at 22 through conductors 23. The DC power is led into the generator enclosure through a low-pass filter 24, filtering away any harmonics produced by the generator and thus preventing the power supply to radiate these harmonics. This filter can comprise at least one coil 26 and at least one capacitor 27 in a LC circuit.

The first stage of the RF generator 10, being the oscillator 20, is powered through a separate low pass filter 25 comprising at least one coil 14 and at least one capacitor C4 in a LC circuit. This enables to start the generator with a row-power switch S while the main part of the supply current is led unswitched to the output stage, being the second amplifier 40.

The RF oscillator 20 can be a crystal-controlled oscillator comprising a transistor Q1 whose emitter circuit includes a coil L1 and a capacitor C2. The input circuit of the transistor Q1 is formed by a crystal Y, a DC-bias resistor R1, and a feedback capacitor C1. The output circuit LCO consisting of a capacitor C3 and a coil L3 forms a resonant network tuned to the fundamental frequency of the crystal Y which can be the 40.68 MHz mentioned earlier.

The output of the RF oscillator 20 is connected to a cascade of amplifiers only the first amplifier 30 and the nth amplifier 40 of the cascade being illustrated.

Each amplifier includes a resistor R2, R4, connected as an input resistance to the base of a respective transistor Q2, Q3, a base-bias resistor R4, R5 and a respective LC resonant network, namely the networks LC1 and LC2. Each LC network feeds the next stage of the amplifier cascade or, in the case of the LC or resonant network of the last amplifier of the cascade, a low-pass filter 50.

The LC networks LC1, LC2, etc. each comprise a capacitor C5, C6... in a parallel resonant network with an inductance L5, L6, .... The output from each amplifier of the cascade to the next stage is tapped from the inductor L5, L6.

The low-pass filter in turn comprises a cascade of LC resonant networks represented at LC3, LC4, LC5 and LC6, respectively.

Each network comprises a coil L7, L8, L9, L10 ... associated with a respective adjustable capacitor C7, C8, C9, C10 .... The output from the low-pass filter 50 is applied to the sealing head with the electrodes 10 and 11.

In addition, the oscillator and amplifier circuits are enclosed in a shielded housing 60 which is grounded and prevents emission of spurious radiation. The connection from the circuitry within the housing to the seal head with the electrodes 10 and 11 is via a coaxial cable 9 as has been previously mentioned.

I claim:
1. An apparatus for sealing medical tubing, comprising:
   a radio-frequency generator having an oscillator circuit, a plurality of amplifier stages forming an amplifier circuit, and respective circuits tuned to said fundamental frequency coupling said amplifier stages;
   a sealing head connected to said radio-frequency generator and having a pair of electrodes adapted to clamp medical tubing between them and excited by RF energy from said radio-frequency generator;
   at least one resonant circuit between said electrodes and said oscillator circuits and including at least one coil and at least one capacitor connected to said coil and tuned to a fundamental frequency of said source;
   a resonant circuit tuned to said fundamental frequency provided at an output of said oscillator circuit and ahead of said amplifier circuit; and
   a radiation-shielded housing enclosing said generator and preventing emission of spurious radiation.

2. The apparatus defined in claim 1, further comprising at least one resonant circuit including a coil and a capacitor and tuned to a fundamental frequency of said source at an output of said generator connected to said electrodes.

3. The apparatus defined in claim 2 wherein said radiation-shielded housing also encloses said resonant circuit at said output of said generator connected to said electrodes.

4. The apparatus defined in claim 1 wherein a low-pass filter is provided on incoming cables of said generator filtering away harmonics of said fundamental frequency on said incoming cable.

* * * * *